United States Patent
Ganesan et al.

(10) Patent No.: US 11,469,785 B2
(45) Date of Patent: Oct. 11, 2022

(54) RECEIVER CIRCUIT WITH INTERFERENCE DETECTION

(71) Applicant: TEXAS INSTRUMENTS INCORPORATED, Dallas, TX (US)

(72) Inventors: Raghu Ganesan, Bengaluru (IN); Gaurav Aggarwal, Delhi (IN); Rahul Koppisetti, Bengaluru (IN); Rallabandi V Lakshmi Annapurna, Bengaluru (IN); Saravanakkumar Radhakrishnan, Aruppukottai (IN); Kalpesh Laxmanbhai Rajai, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/200,060

(22) Filed: Mar. 12, 2021

(65) Prior Publication Data
US 2021/0288684 A1    Sep. 16, 2021

(30) Foreign Application Priority Data

Mar. 13, 2020  (IN) .............................. 202041010814
Mar. 13, 2020  (IN) .............................. 202041010817
Mar. 13, 2020  (IN) .............................. 202041010820

(51) Int. Cl.
*H04B 1/10*      (2006.01)
*H04B 1/12*      (2006.01)
(Continued)

(52) U.S. Cl.
CPC .......... *H04B 1/1036* (2013.01); *H03M 1/004* (2013.01); *H03M 1/0604* (2013.01);
(Continued)

(58) Field of Classification Search
CPC .... H04B 15/02; H04B 17/336; H04B 1/1036; H04B 15/00; H04B 1/0475; H04B 1/10;
(Continued)

(56) References Cited

U.S. PATENT DOCUMENTS

| 1,115,040 A | 10/1914 | Voight |
| 9,077,574 B1 | 7/2015 | Healey et al. |

(Continued)

FOREIGN PATENT DOCUMENTS

| EP | 0929945 | 12/2005 |
| EP | 2806570 | 11/2014 |

OTHER PUBLICATIONS

International Search Report in corresponding PCT Application No. PCT/US2021/022351, dated Jun. 24, 2021 (4 pages).
(Continued)

*Primary Examiner* — Nhan T Le
(74) *Attorney, Agent, or Firm* — John R. Pessetto; Charles A. Brill; Frank D. Cimino

(57) ABSTRACT

A receiver circuit includes an ADC, a processing channel, and an interference detection path. The processing channel is configured to process data samples provided by the ADC, and includes a notch filter. The interference detection path is configured to detect interference in the data samples, and includes a slicer, a slicer error circuit, and an interference detection circuit. The slicer is configured to slice input of the notch filter. The slicer error circuit is configured to compute an error of the slicer. The interference detection circuit configured to detect an interference signal in the error of the slicer, and set the notch filter to attenuate the interference signal.

20 Claims, 7 Drawing Sheets

(51) Int. Cl.
  *H04B 1/16* (2006.01)
  *H03M 1/00* (2006.01)
  *H03M 1/06* (2006.01)
  *H03M 1/50* (2006.01)

(52) U.S. Cl.
  CPC ......... *H03M 1/0687* (2013.01); *H03M 1/502* (2013.01); *H04B 1/12* (2013.01); *H04B 1/1607* (2013.01); *H04B 2001/1063* (2013.01)

(58) Field of Classification Search
  CPC ........ H04B 1/719; H04B 1/12; H04B 1/1607; H04B 2001/1063; H03M 1/004; H03M 1/0604; H03M 1/0687; H03M 1/502
  See application file for complete search history.

(56) References Cited

U.S. PATENT DOCUMENTS

| | | | |
|---|---|---|---|
| 9,215,107 | B1 | 12/2015 | De Bernardinis |
| 9,673,910 | B1 | 6/2017 | Crivelli et al. |
| 9,838,072 | B1 * | 12/2017 | Dai ................... H04L 25/03885 |
| 10,203,809 | B2 | 2/2019 | Sobel et al. |
| 10,536,155 | B1 | 1/2020 | Otte |
| 10,720,936 | B1 | 7/2020 | Xu |
| 11,063,793 | B1 | 7/2021 | Xavier et al. |
| 2003/0072059 | A1 | 4/2003 | Thomas et al. |
| 2003/0099208 | A1 | 5/2003 | Graziano et al. |
| 2007/0133719 | A1 | 6/2007 | Agazzi et al. |
| 2008/0240325 | A1 | 10/2008 | Agazzi et al. |
| 2009/0135035 | A1 | 5/2009 | Fifield |
| 2009/0185613 | A1 | 7/2009 | Agazzi et al. |
| 2009/0207925 | A1 | 8/2009 | Liu |
| 2010/0309963 | A1 | 12/2010 | Agazzi et al. |
| 2011/0211842 | A1 | 9/2011 | Agazzi et al. |
| 2014/0064352 | A1 | 3/2014 | Zhong |
| 2014/0266823 | A1 | 9/2014 | Biallais et al. |
| 2014/0348276 | A1 | 11/2014 | Pandey et al. |
| 2016/0308627 | A1 | 10/2016 | Park et al. |
| 2017/0070952 | A1 | 3/2017 | Balakrishnan et al. |
| 2019/0173480 | A1 | 6/2019 | Ryu et al. |
| 2020/0092053 | A1 | 3/2020 | Bai et al. |
| 2021/0028791 | A1 | 1/2021 | Xu |
| 2021/0218604 | A1 * | 7/2021 | Wu ................... H04L 25/03057 |
| 2021/0288684 | A1 | 9/2021 | Ganesan et al. |

OTHER PUBLICATIONS

International Search Report in corresponding PCT Application No. PCT/US2021/022344, dated Jun. 17, 2021 (2 pages).
International Search Report in corresponding PCT Application No. PCT/US2021/022349, dated May 27, 2021 (2 pages).
Notice of Allowance for corresponding U.S. Appl. No. 17/200,426 dated Mar. 11, 2022, 47 pgs.

* cited by examiner

RECEIVER CIRCUIT WITH INTERFERENCE DETECTION

CROSS-REFERENCE TO RELATED APPLICATIONS

This application claims priority to India Provisional Application 202041010820, filed Mar. 13, 2020, titled "Interleaving ADC Error Correction Methods for Ethernet PHY," India Provisional Patent Application No. 202041010814, filed Mar. 13, 2020, titled "Novel Low Power Methods For Signal Processing Blocks In Ethernet PHY," and India Provisional Application 202041010817, filed Mar. 13, 2020, titled "Radio Frequency Interference (RFI) Mitigation for Wireline Applications," each of which is hereby incorporated by reference in its entirety. U.S. patent application Ser. No. 17/199,142, filed Mar. 11, 2021, titled "Low Power Methods for Signal Processing Blocks in Ethernet PHY" is also hereby incorporated by reference herein in its entirety.

BACKGROUND

Wired communication networks, such as Ethernet, are used to provide communication in a wide variety of applications. For example, in automotive applications, Ethernet is used to provide communication for safety systems and infotainment systems. In such systems, Ethernet communication reliability is important.

SUMMARY

A receiver circuit includes an analog-to-digital converter (ADC), a notch filter, a slicer, a slicer error circuit, and an interference detection circuit. The ADC includes an output. The notch filter includes a signal input, an interference frequency input, and an output. The signal input is coupled to the output of the ADC. The slicer includes an input and an output. The input of the slicer is coupled to the input of the notch filter. The slicer error circuit includes a first input, a second input, and an error output. The first input is coupled to the input of the slicer. The second input is coupled to the output of the slicer. The interference detection circuit includes an input and an interference frequency output. The input of the interference detection circuit is coupled to the error output of the slicer error circuit. The interference frequency output is coupled to the interference frequency input of the notch filter.

A receiver circuit includes an ADC, a processing channel, and an interference detection path. The processing channel is configured to process data samples provided by the ADC, and includes a notch filter. The interference detection path is configured to detect interference in the data samples, and includes a slicer, a slicer error circuit, and an interference detection circuit. The slicer is configured to slice input of the notch filter. The slicer error circuit is configured to compute an error of the slicer. The interference detection circuit configured to detect an interference signal in the error of the slicer, and set the notch filter to attenuate the interference signal.

A digital signal processing circuit includes a first processing channel, a second processing channel, and an interference detection path. The first processing channel is configured to process first data samples received from an ADC, and includes a first notch filter configured to filter the first data samples. The second processing channel is configured to process second data samples received from the ADC, and includes a second notch filter configured to filter the second data samples. The interference detection path is configured to detect interference signal in the first data samples and the second data samples. The interference detection path includes a first slicer, a first slicer error circuit, a second slicer, a second slicer error circuit, a multiplexer, and an interference detection circuit. The first slicer is configured to slice input of the first notch filter. The first slicer error circuit is configured to compute an error of the first slicer. The second slicer is configured to slice output of the second notch filter. The second slicer error circuit is configured to compute an error of the second slicer. The multiplexer is configured to select error of the second slicer or error of the third slicer as an interference source signal. The interference detection circuit is configured to detect an interference signal in the interference source signal, and set the first notch filter and the second notch filter to attenuate the interference signal.

BRIEF DESCRIPTION OF THE DRAWINGS

For a detailed description of various examples, reference will now be made to the accompanying drawings in which.

DETAILED DESCRIPTION

In automotive, and other applications, Ethernet physical layer circuits (e.g., Ethernet receivers) are expected to provide reliable communication in the presence of radio frequency interference (RFI). Some Ethernet receiver circuits employ RFI mitigation using fast Fourier transform (FFT) based interference detection to control notch filters that attenuate the interference. However, detection of RFI in the presence of signal and echo requires a high-resolution FFT (e.g., a 16384 sample FFT), which increases the circuit area and cost of the receiver.

The receiver circuits disclosed herein use slicer error to identify interference signals. The slicer error does not include signal or echo. The size of the FFT applied to identify interference signals, and the time needed to identify interference signals are greatly reduced. For example, a 512 sample FFT is applied in some implementations, which reduces the circuit area and cost of the receiver. The receiver includes a dedicated interference detection path, that lacks a notch filter, to determine whether interference signal is present. When the interference detection path detects no interference signal, the notch filters in the data processing channels of the receiver are turned off to save power. Turning off the notch filters when no interference signal is present also improves the signal-to-noise ratio of the processing channels.

Figure 1:
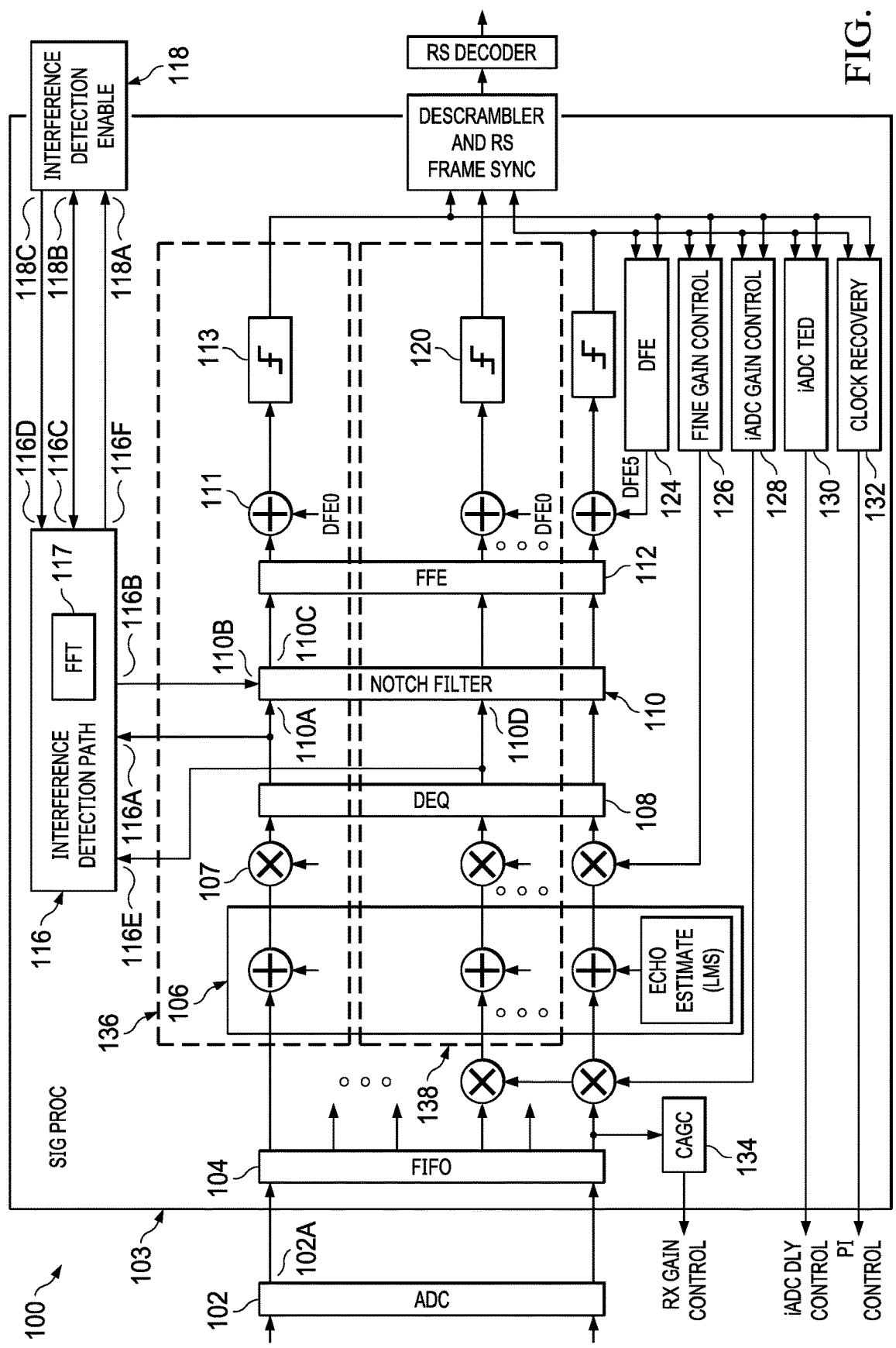
FIG. 1 shows a block diagram for example receiver physical layer circuitry that includes detection and filtering of interference signal.

FIG. 1 shows a block diagram for an example receiver circuit 100 that includes detection and filtering of interference signal. The receiver circuit 100 may be applied in an Ethernet receiver, or other wireline or wireless receiver circuit. The receiver circuit 100 includes an analog-to-digital converter (ADC) 102 and a digital signal processing circuit 103 coupled to the ADC 102. The ADC 102 is an interleaved ADC in some implementations of the receiver circuit 100. In some alternative embodiments, filters (e.g. high-pass filters), delays, amplifiers, and clock generation circuitry may be included and directly or indirectly coupled between the incoming RF signal and ADC 102.

The digital signal processing circuit 103 includes a first-in-first-out (FIFO) memory 104. The FIFO memory 104 stores digital samples received from the ADC 102, and provides each sample to one of multiple (N) processing channels. Processing channel 136 and processing channel 138 are shown in FIG. 1. Processing channel 136 and processing channel 138 receive, from the FIFO memory 104, and process digital samples produced by the ADC 102. Some implementations of the digital signal processing circuit 103 may include more than two processing channels. For example, an implementation of the digital signal processing circuit 103 may include six processing channels. One or more of the processing channels is coupled to the interference detection path 116 and the interference detection enable circuit 118.

Each processing channel includes echo cancellation circuitry 106, a multiplier, a digital equalizer 108, a notch filter circuit 110, a feed-forward equalizer 112, an adder, and a slicer. The slicer is a three-level pulse amplitude modulation (PAM-3) slicer in some implementations of the digital signal processing circuit 103. In the processing channel 136, the echo cancellation circuitry 106 is coupled to the digital equalizer 108 via the multiplier 107. The echo cancellation circuitry 106 multiplies received symbols by echo cancellation coefficients to reduce echo in received signal. The digital equalizer 108 is a digital filter that corrects for ISI due to the transmission channel. The digital equalizer 108 is coupled to the notch filter circuit 110. The notch filter circuit 110 attenuates interference signal in the received signal. The notch filter circuit 110 is coupled to the feed-forward equalizer 112. The feed-forward equalizer 112 corrects pre-cursor ISI (ISI resulting from a previously transmitted symbol). The feed-forward equalizer 112 may be implemented as a finite impulse response (FIR) filter. The feed-forward equalizer 112 is coupled to the slicer 113 via the adder 111. Components of other processing channels (e.g., the processing channel 138) are similarly connected.

The digital signal processing circuit 103 includes a fine gain control circuit 126, a decision feedback equalization (DFE) circuit 124, a clock recovery circuit 132, an ADC gain control circuit 128, and a timing error detector circuit 130, each of which is coupled to one or more of the slicers. The fine gain control circuit 126 is coupled to an input of the multipliers (e.g., the multiplier 107) and coupled to the outputs of the slicers (e.g., slicer 113) to control the fine gain applied to the output of the echo cancellation circuitry 106. The DFE circuit 124 is coupled to the adders (e.g., the adder 111) at the inputs of the slicers to provide equalization feedback to the inputs of the slicers. The clock recovery circuit 132 is coupled to a clock source (not shown) to adjust the phase of the clock signals provided to the ADC 102.

The ADC gain control circuit 128 adjusts the gain of signal at one or more outputs of the FIFO memory 104 to equalize the amplitude of samples output by interleaved ADCs of the ADC 102. Gain adjustment is provided to the digital samples generated by a first ADC of the ADC 102, and no gain adjustment is provided to the digital samples generated by a second ADC of the ADC 102, so that the gain applied to digital samples of the first and second ADCs is made equal. In alternative embodiments, gain adjustments are provided to digital samples from both ADCs so as to equalize the gain.

The timing error detector circuit 130 determines the timing error (skew) of the ADCs of the ADC 102, and controls delay applied to the clocks that time the operations of the ADCs to reduce the timing skew.

The coarse automatic gain control 134 analyzes the amplitude of signal output of the FIFO memory 104 and adjusts the amplitude to a predetermined range by providing a coarse gain control signal to a gain control circuit (e.g., a programmable gain amplifier) (not shown) that provides signal to be digitized to the ADC 102.

The notch filter circuit 110, the interference detection path 116, and the interference detection enable circuit 118 operate to detect and attenuate interference signal (e.g., radio frequency interference) in the signal processed by the digital signal processing circuit 103. The interference detection path 116 detects the presence and frequency of an interference signal and sets the center frequency of the notch filter circuit 110 to attenuate the interference signal. The interference detection path 116 provides improved detection of interference signal with reduced circuit complexity by applying a slicer error (e.g., of one or more processing channels) transformed to frequency domain by a relatively small FFT (e.g., 512 sample) to identify interference signal. The interference detection path 116 includes an FFT circuit 117 to transform slicer error signal to a frequency domain signal. The interference detection path 116 may identify interference signal by comparing FFT bin magnitude values to a threshold. Bin magnitude exceeding the threshold may be deemed to indicate interference signal.

In the processing channel 136, an input 110A of the notch filter circuit 110 is coupled to an input 116A of the interference detection path 116 for provision of signal not processed by the notch filter circuit 110. An interference frequency output 116B of the interference detection path 116 is coupled to an interference frequency input 110B of the notch filter circuit 110 for provision of notch filtering parameters (e.g., interference frequency). In the processing channel 138, an input 110E of the notch filter circuit 110 is coupled to an input 116E of the interference detection path 116 116 for provision of signal not processed by the notch filter circuit 110.

Figure 2:
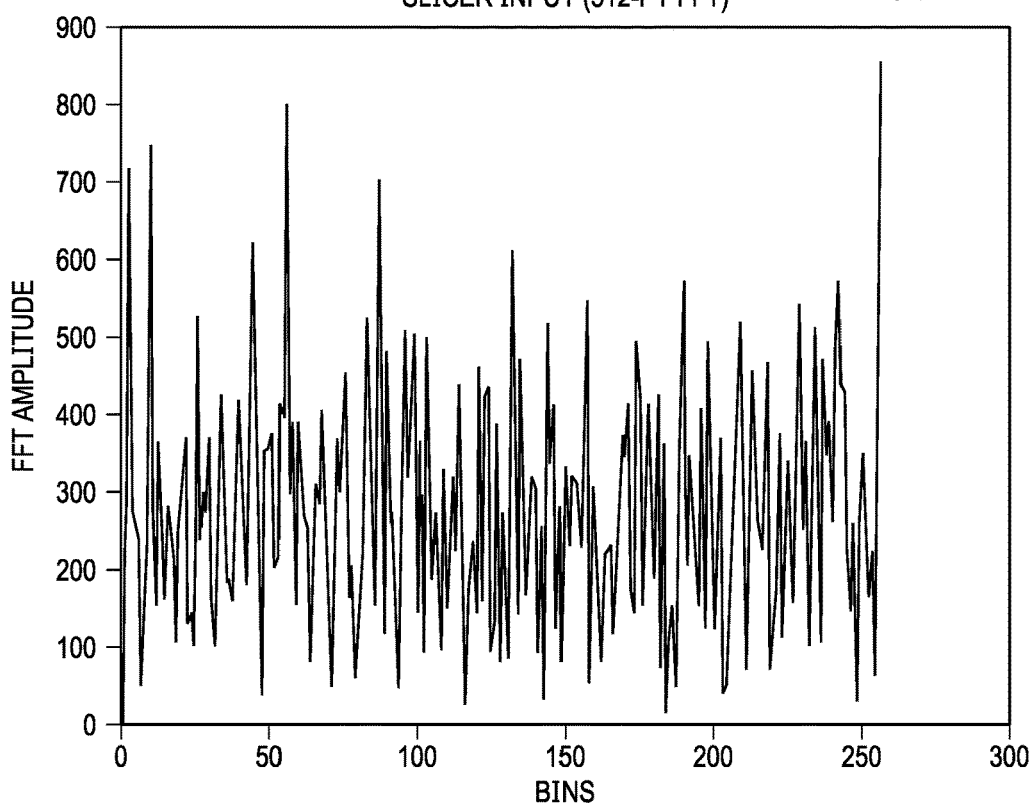
FIG. 2 shows a graph of example frequency domain slicer input computed with a 512 sample fast Fourier transform (FFT)
Figure 3:
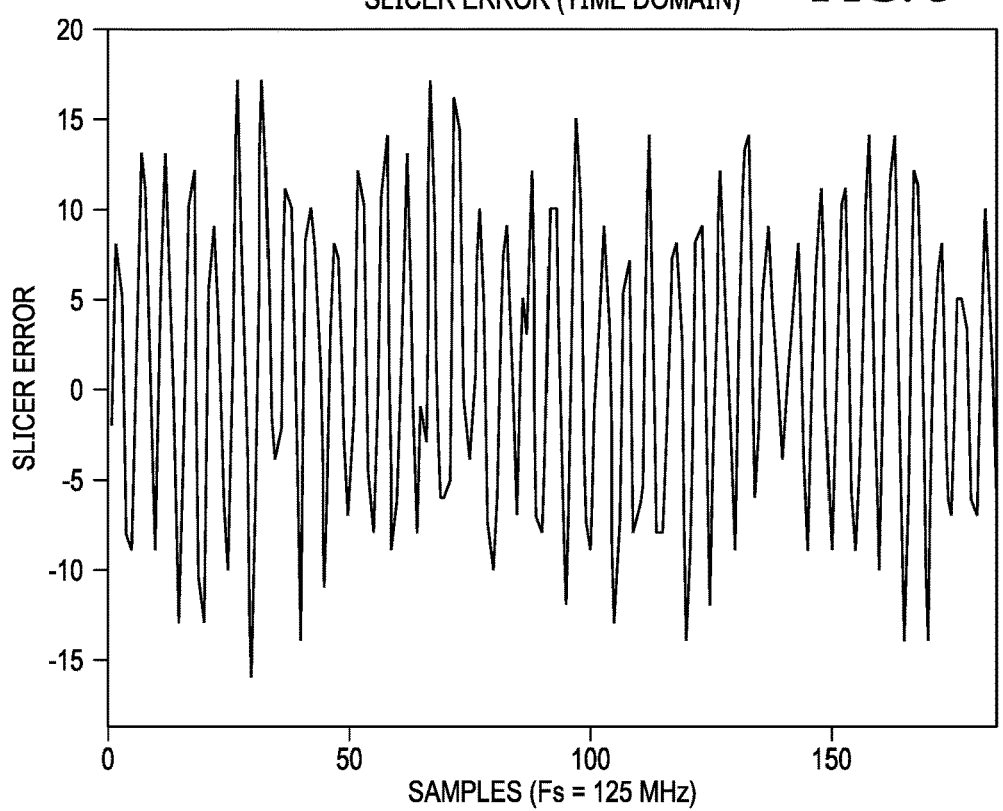
FIG. 3 shows a graph of example time domain slicer error signal.
Figure 4:
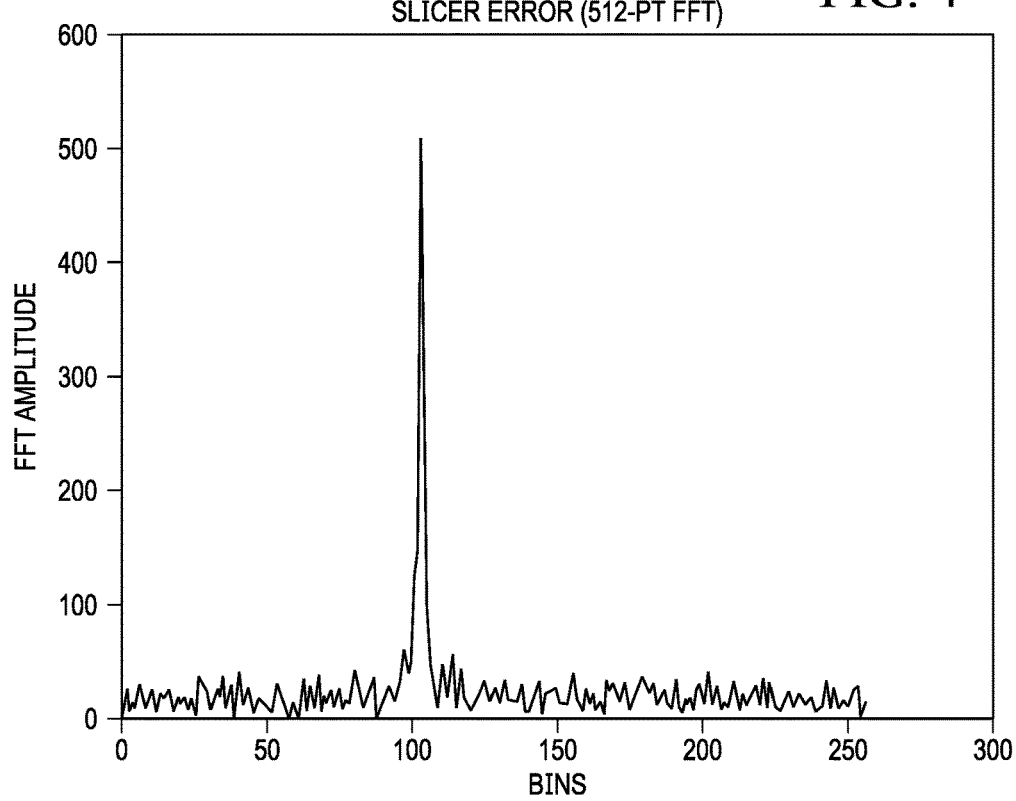
FIG. 4 shows a graph of example frequency domain slicer error signal computed with a 512 sample FFT.

FIGS. 2-5 illustrate the advantage of detecting interference based on slicer error. FIG. 2 shows input to a slicer converted to frequency domain using a 512 sample FFT. In FIG. 2, the x-axis represents FFT bins, and the y-axis represents FFT amplitude. No interference signal can be clearly detected in the slicer input. A higher resolution FFT (e.g., a 16,384 sample FFT) is needed to identify interference in the slicer input signal. FIG. 3 shows a graph of example time domain slicer error signal output by a slicer error circuit (see e.g., FIG. 8). In FIG. 3, the x-axis represents sample index, and the y-axis represents slicer error. FIG. 4 shows a graph of the slicer error signal of FIG. 3 after conversion to frequency domain by the FFT circuit 117 using a 512 sample FFT. In FIG. 4, the x-axis represents FFT bins, and the y-axis represents FFT amplitude. The frequency of the interference signal is clearly identifiable in the frequency domain slicer error signal at about bin 100.

Figure 5:
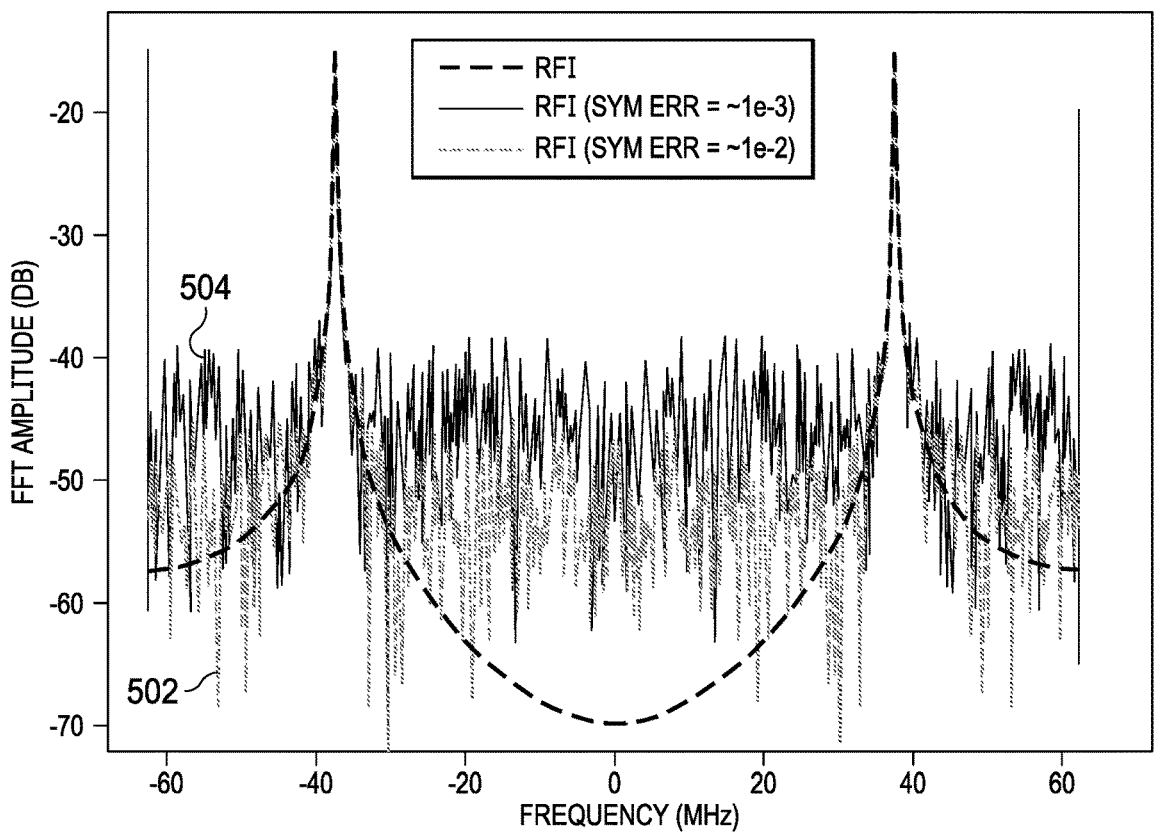
FIG. 5 shows example interference signal spectrum derived from slicer error signal with and without symbol errors.

FIG. 5 shows example interference signal spectrum derived from slicer error signal with symbol errors. In FIG. 5, the x-axis represents frequency in megahertz, and the y-axis represents FFT amplitude in decibels. Signals 502 and 504 include symbol errors at rates of $10^{-2}$ and $10^{-3}$ respectively. FIG. 5 shows that, even in the presence of symbol errors, the interference detection path 116 can clearly identify interference signal using signal spectrum derived from the frequency domain slicer error.

Figure 6:
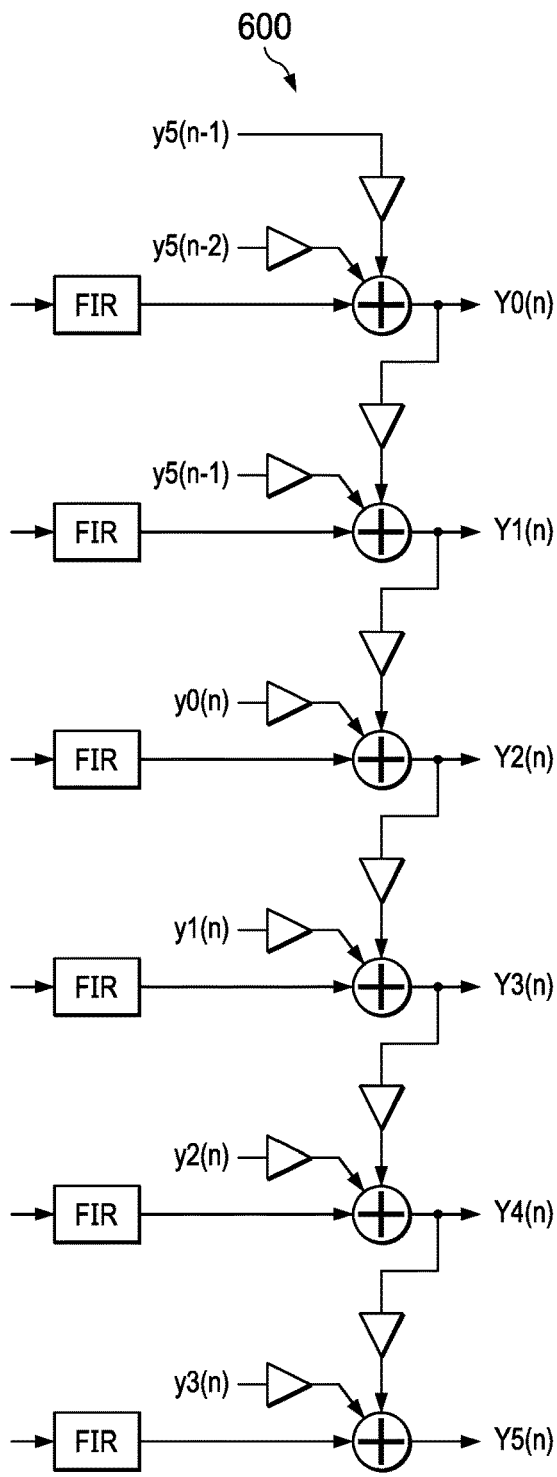
FIG. 6 shows a block diagram for an example notch filter that operates at the full symbol rate of the receiver.

Having identified the presence and frequency of an interference signal in the slicer error signal, the interference detection path 116 sets the notch filter circuit 110 to attenuate the interference signal. FIG. 6 shows a block diagram for an example parallel notch filter 600 that operates at the full symbol rate of the receiver. The parallel notch filter 600 includes a finite impulse response (FIR) section and an infinite impulse response (IRR) section in each processing channel. The notch transfer function, N(z), is expressed as:

$$N(z) = \frac{1 - 2\cos\frac{2\pi f}{Fs}z^{-1} + z^{-2}}{1 - 2r\cos\frac{2\pi f}{Fs}z^{-1} + r^2z^{-2}} \quad (1)$$

where:
the FIR section is expressed in the numerator; and
the IIR section is expressed in the denominator.

Figure 7:
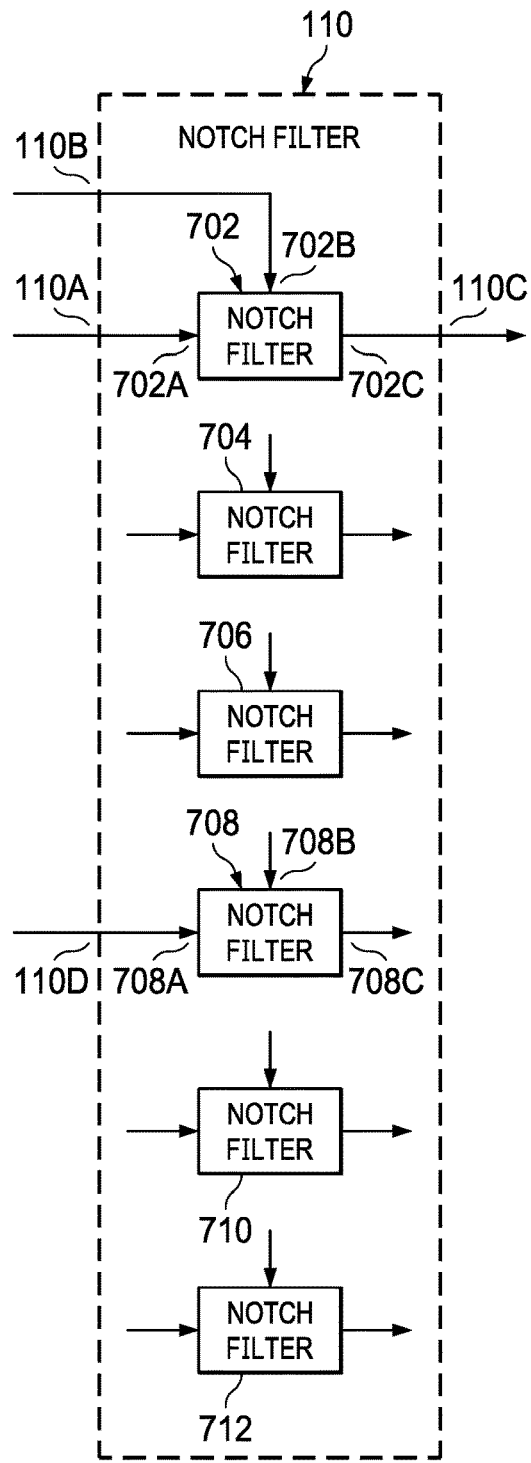
FIG. 7 shows a block diagram for an example notch filter circuit that includes a notch filter in each processing path of the receiver.

Implementation of the parallel notch filter 600 is difficult and expensive at high frequencies (e.g., 750 megahertz (MHz)) due the lookahead computations needed in the IIR section. The notch filter circuit 110 (FIG. 7) avoids the difficulties of the parallel notch filter 600 by implementing an independent notch filter in each processing path. FIG. 7 shows a block diagram for an example notch filter circuit 110 that includes a notch filter in each processing path of the receiver. Thus, for six processing channels, the notch filter circuit 110 includes six notch filters (notch filter 702, notch filter 704, notch filter 706, notch filter 708, notch filter 710, and notch filter 712) each operating independently from the others. For example, the notch filter 702 is coupled to the slicer 113, and the notch filter 708 is coupled to the slicer 120. Each of the notch filters operates at a fraction (1/N, where N is the number of processing paths) of the operating frequency of the parallel notch filter 600 (e.g., 125 MHz versus 750 MHz). The multiple notch filters effectively create multiple notches in the spectrum of the signal processed by the digital signal processing circuit 103. However, with a relatively narrow notch width (e.g., 120 kilohertz), the effect of the notches on signal-to-noise ratio is relatively small. The notch filter circuit 110 uses no look ahead computations, which greatly simplifies implementation of the notch filter circuit 110 compared to the parallel notch filter 600, and reduces circuit area and cost.

In some implementations of the digital signal processing circuit 103, the notch filter circuit 110 and the FFT circuit 117 consume a substantial amount of power (e.g., 30 milliwatts) when operating. Referring back to FIG. 1, when the notch filter circuit 110 is enabled to attenuate an interference signal, the interference signal is no longer present (or is very small) in the slicer error signal output by a slicer error circuit. Therefore, the slicer error signal produced by a slicer error circuit in any of the processing paths (e.g., processing path 136 or 138) of the digital signal processing circuit 103 cannot be used to detect the continued presence or absence of a previously detected interference signal.

Figure 8:
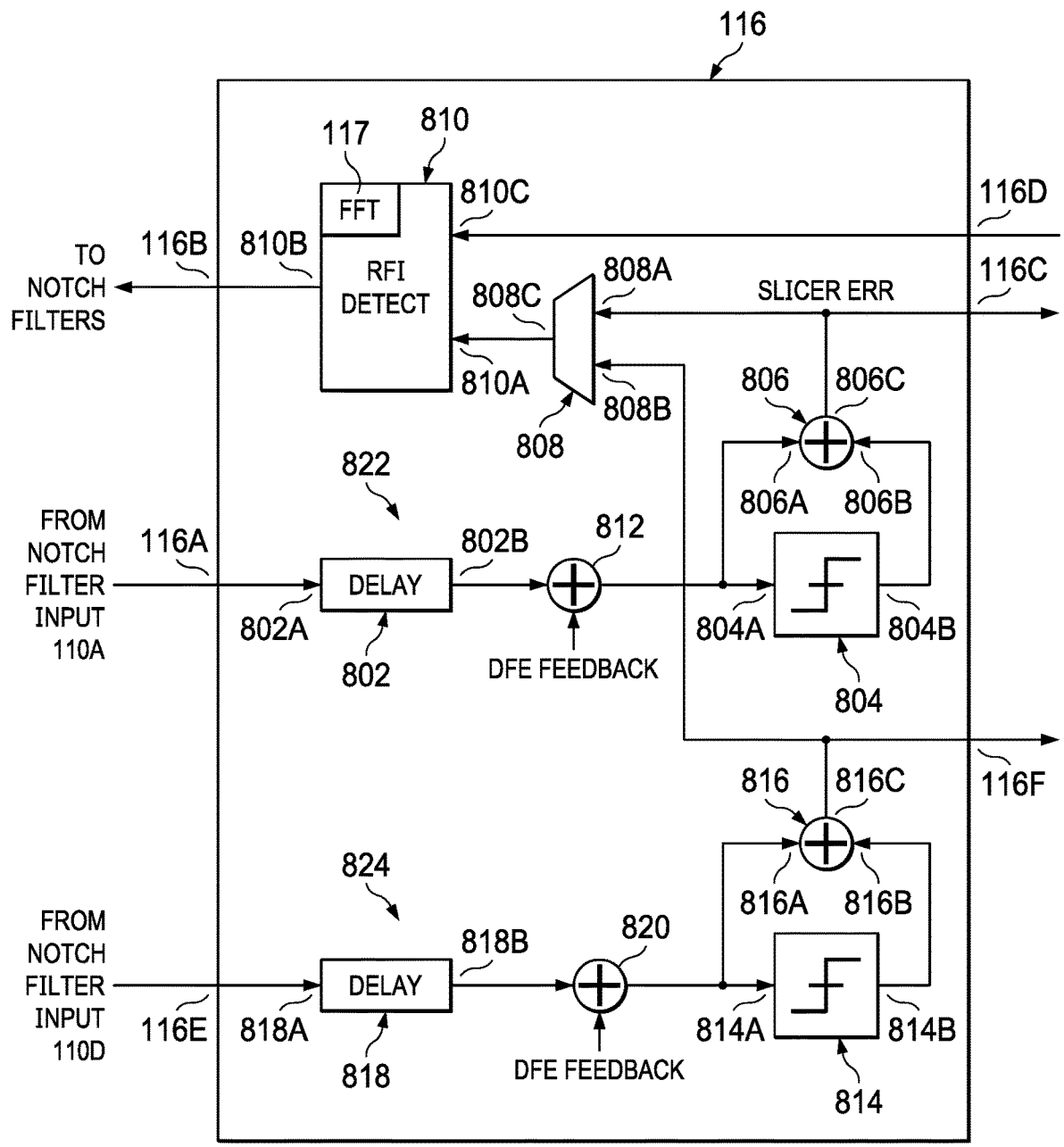
FIG. 8 shows a block diagram for an example interference detection path suitable for use in a receiver.

FIG. 8 shows a block diagram for an example interference detection path 116 that enables the FFT circuit 117 and the notch filter circuit 110 to be turned off when previously detected interference is no longer present. Because interference signal is attenuated at the outputs of the notch filter circuit 110, the error of slicers in the processing channels cannot be used to reliably detect interference, To provide reliable detection, the interference detection path 116 monitors signal at the input of the notch filter circuit 110 to identify interference. The interference detection path 116 includes a first slicing path 822 and a second slicing path 824 that generate slicer error for the processing channel 136 and the processing channel 138 respectively. The slicer errors generated in the slicing paths 822 and 824 are routed to an interference detection circuit 810 by a multiplexer 808.

The first slicing path 822 includes a delay circuit 802, a slicer 804, and a slicer error circuit 806. The delay circuit 802 provides a delay time that matches the delay of the notch filter circuit 110 and the feed-forward equalizer 112 (or any delay between the input of the notch filter circuit 110 and the input of the adder 111). An input 802A of the delay circuit 802 is coupled to an input 110A of the notch filter circuit 110 for receipt of signal, and an output 802B of the delay circuit 802 is coupled to an input 804A of the slicer 804 via the adder 812. The adder 812 sums the delayed input of the notch filter circuit 110 received from the delay circuit 802 with DFE feedback received from the DFE circuit 124 (the same DFE feedback as is provided to the adder 111). The slicer error circuit 806 computes slicer error for the slicer 804. An input 806A of the slicer error circuit 806 is coupled to the input 804A of the slicer 804, and an input 806B of the slicer error circuit 806 is coupled to the output 804B of the slicer 804. An output 806C of the slicer error circuit 806 is coupled to the input 810A of the interference detection circuit 810 via the multiplexer 808.

The second slicing path 824 includes a delay circuit 818, a slicer 814, and a slicer error circuit 816. The delay circuit 818 provides a delay that matches the delay of the notch filter circuit 110 and the feed-forward equalizer 112 (or any delay between the input of the notch filter circuit 110 and the input of the adder 111. An input 818A of the delay circuit 818 is coupled to an input 110D of the notch filter circuit 110 for receipt of signal, and an output 818B of the delay circuit 818 is coupled to an input 814A of the slicer 814 via the adder 820. The adder 820 sums the delayed data received from the delay circuit 818 with DFE feedback received from the DFE circuit 124 (the same DFE feedback as is provided to the adder 111). The slicer error circuit 816 computes slicer error for the slicer 814. An input 816A of the slicer error circuit 816 is coupled to the input 814A of the slicer 814, and an input 816B of the slicer error circuit 816 is coupled to the output 814B of the slicer 814. An output 816C of the slicer error circuit 816 is coupled to the input 810A of the interference detection circuit 810 via the multiplexer 808.

The output 810B of the interference detection circuit 810 is coupled to the interference frequency input 1106 of the notch filter circuit 110 (e.g., the interference frequency input 702B of the notch filter 702, the interference frequency input 708B of the notch filter 708, etc.). When the interference detection circuit 810 detects an interference signal using a low resolution FFT (e.g., a 512 sample FFT), some implementations of the interference detection circuit 810 execute a higher-resolution FFT (e.g., a 2048 or 4096 sample FFT) for frequencies in a small range (+/−2 bins) about the detected interference signal to better resolve the interference frequency. When the interference detection circuit 810 detects no interference signal, the interference detection circuit 810 disables (e.g., turns off) the FFT circuit 117 and the notch filter circuit 110 to reduce power consumption. When the notch filter circuit 110 is disabled, the notch filter circuit 110 passes input data to its output without notch filtering. Delay applied to data in the notch filter circuit 110 is the same when the notch filter circuit 110 is enabled or disabled.

When the interference detection path 116 detects interference via a single processing channel (e.g., data from the processing channel 136), interference signal near one-half of the sampling frequency (Fs/2) may be undetectable if the signal is sampled at or near a zero-crossing. To resolve this issue, the interference detection path 116 uses the second slicing path 824 to monitor data from a second processing channel (e.g., the processing channel 138) when no interference is detected in the first processing channel. For example, the interference detection path 116 monitors slicer error of the slicer 814 when no interference is detected in the slicer error of the slicer 804. When monitoring the slicer error of the slicer 814, the interference detection circuit 810 converts only the frequency bins about the sampling point of the slicer 814 to reduce power consumption. The multiplexer 808 selects the slicer error output by the slicer error circuit 806 or the slicer error output by the slicer error circuit 816 to be an interference source signal to provide to the interference detection circuit 810 for interference detection. When no interference is detected in the slicer error output of the slicer error circuit 806, the multiplexer 808 selects the slicer error output of the slicer error circuit 816. The multiplexer 808 includes an input 808A coupled to the output 806C of the slicer error circuit 806, an input 808B coupled to the output 816C of the slicer error circuit 816, and an output 808C coupled to the input 810A of the interference detection circuit 810.

Figure 9:
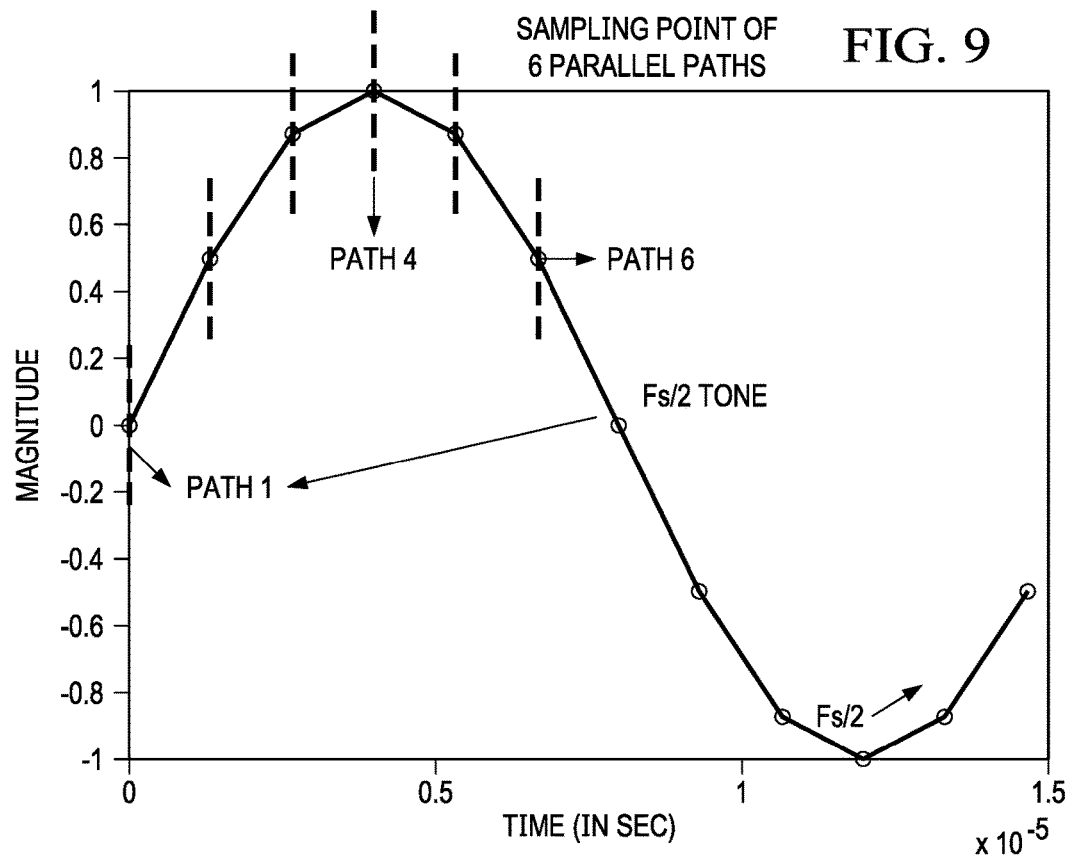
FIG. 9 shows a graph of an example of sample timing for a signal of one-half the sampling frequency in multiple processing paths of a receiver.

FIG. 9 shows a graph of example sampling points of six parallel processing channels for an Fs/2 tone, where Fs is the processing path sample frequency. If the processing channel 136 is sampling the tone at a zero-crossing (inhibiting detection of Fs/2 interference), then the other processing channels are not sampling at a zero-crossing. In FIG. 9, the processing channel 138 is sampling the tone at its peak. Therefore, the interference detection path 116 monitors slicer error using data from the processing channel 136 and the processing channel 138 to detect interference. When monitoring the slicer error of data from the processing channel 138, the interference detection circuit 810 converts only the frequency bins about the sampling point of the processing channel 138 to reduce power consumption in some implementations of the interference detection circuit 810.

Figure 10:
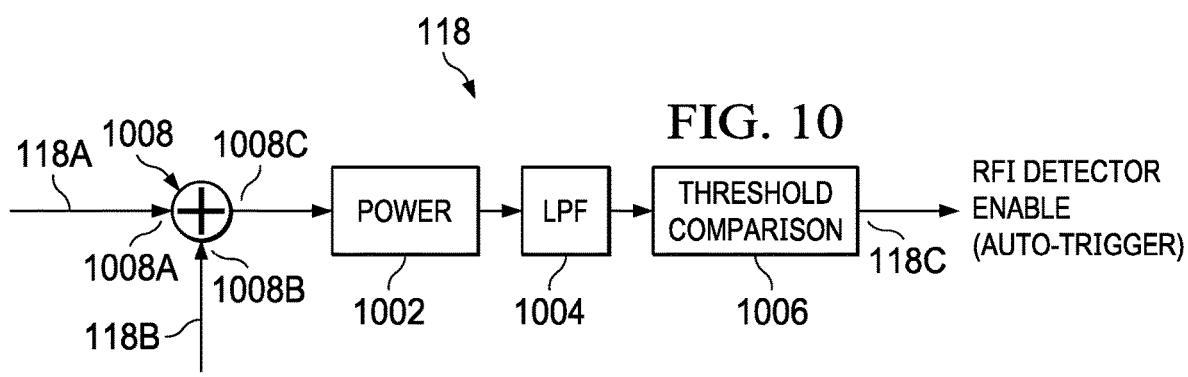
FIG. 10 shows a block diagram for an example interference detection enable circuit suitable for use with the interference detection path of FIG. 8.

FIG. 10 shows a block diagram for an example interference detection enable circuit 118. The interference detection enable circuit 118 monitors the mean squared error (MSE) of the slicer 804 and the slicer 814 to detect the presence of interference signal, and determine whether to enable the interference detection circuit 810. The interference detection enable circuit 118 includes an input 118A, an input 118B, an output 118C, a power circuit 1002, a low pass filter circuit 1004, a threshold comparison circuit 1006, and an adder 1008. The input 1186 is coupled to the output 806C of the slicer error circuit 806 (see FIG. 8). The input 118A is coupled to the output 816C of the slicer error circuit 816 (see FIG. 8). The output 118C is coupled to the enable input 810C of the interference detection circuit 810, and the enable input 116D of the interference detection path 116 (see FIG. 8). The adder 1008 sums the slicer error of the slicer 804 and the slicer error of the slicer 814. An input 1008B of the adder 1008 is coupled to the output 806C of the slicer error circuit 806, and input 1008A of the adder 1008 is coupled to the output 816C of the slicer error circuit 816. An output 1008C of the adder 1008 is coupled to the power circuit 1002. The power circuit 1002 computes the power of the summed slicer error signals (e.g. computes the square of the summed slicer error signals). The power circuit 1002 provides the power signal to the low-pass filter circuit 1004. The low-pass filtered power signal is provided to the threshold comparison circuit 1006. The threshold comparison circuit 1006 compares the output of the low pass filter circuit 1004 to a threshold value. If the output of the low pass filter circuit 1004 exceeds the threshold value, then the interference detection enable circuit 118 triggers/enables the interference detection circuit 810 to detect an interference signal. Until the interference detection enable circuit 118 triggers/enables the interference detection circuit 810 to detect an interference signal, the interference detection circuit 810 and the notch filter circuit 110 are disabled/turned off to reduce power consumption.

Figures 11, 12:
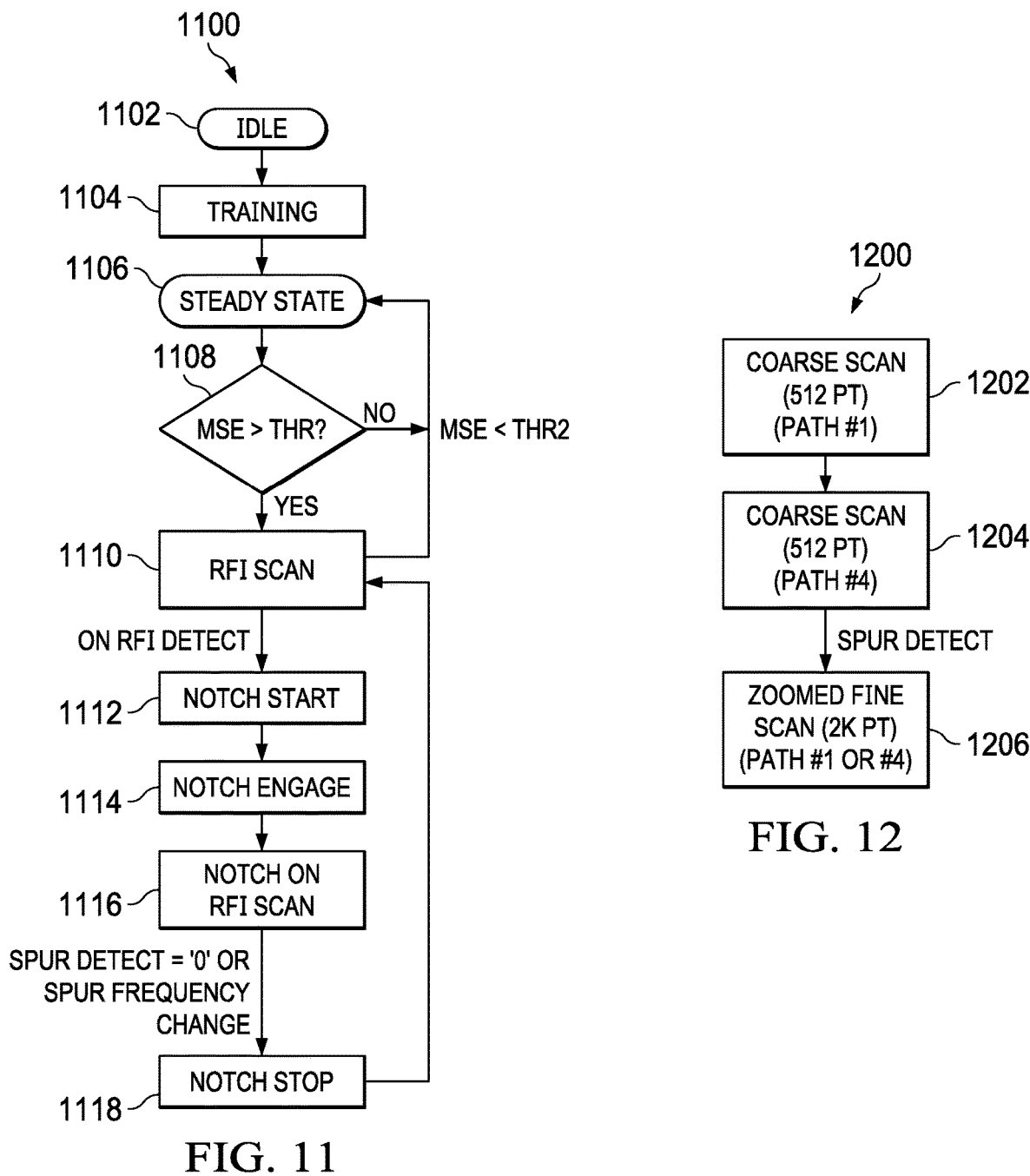
FIG. 11 shows a flow diagram for an example method for operating interference detection circuitry in a receiver.
FIG. 12 shows a flow diagram for an example method for interference detection in the interference detection path of FIG. 8.

FIG. 11 shows a flow diagram for an example method 1100 for operating interference detection circuitry in a receiver. Though depicted sequentially as a matter of convenience, at least some of the actions shown can be performed in a different order and/or performed in parallel. Additionally, some implementations may perform only some of the actions shown. Operations of the method 1100 are performed by an implementation of the receiver circuit 100.

In block 1102, signal is received, and the receiver circuit 100 begins initialization to allow operation.

In block 1104, various filters and control loops of the receiver circuit 100 are initialized. For example, course and fine gain applied to input signal are adjusted via the coarse automatic gain control 134 and the fine gain control circuit 126. Gain and timing of interleaved ADCs are adjusted via the ADC gain control circuit 128 and the timing error detector circuit 130. Phase of clock signals provided to the ADCs is adjusted via the clock recovery circuit 132. The various equalizers, e.g., the digital equalizer 108, the feedforward equalizer 112, and the DFE circuit 124, of the digital signal processing circuit 103 are initialized. The echo cancellation circuitry 106 is trained.

In block 1106, the receiver circuit 100 processes received signal in steady state operation, and the control loops initialized in block 1104 are operating. The presence of an interference signal can cause the loops to unlock due to inter-dependency between the loops.

In block 1108, the interference detection enable circuit 118 compares the MSE of the slicers 804 and 814 to a threshold value. If the MSE exceeds the threshold value, then the interference detection enable circuit 118 enables the interference detection path 116 to detect an interference signal.

In block 1110, the interference detection path 116 analyzes slicer error to determine whether an interference signal is present. Additional explanation of the operations of block 1110 is provided in FIG. 12.

If no interference signal is detected in block 1110, then the method 1100 continues in block 1106. If an interference signal is detected, then the control loops of the receiver circuit 100 are locked (updating of loop parameters is disabled) to prevent link instability and execution continues in block 1112.

In block 1112, the interference detection path 116 provides parameters of operation (e.g., notch frequency information) to the notch filter circuit 110 and initiates operation of the notch filter circuit 110. The notch filter circuit 110 is not engaged in the data path (i.e., the notch filter circuit is outputting unfiltered data). The notch filter circuit 110 processes received data and is allowed to settle. When the notch filter circuit 110 is not engaged in the data path, the delay applied to unfiltered data passing through the notch filter circuit 110 is the same as if the notch filter circuit 110 were engaged in the data path.

In block 1114, the notch filter circuit 110 has settled (e.g., a predetermined settling interval has expired), and is engaged in the data path. That is, notch filtered data produced by the notch filter circuit 110 is provided to the feed-forward equalizer 112, the adder 111, the slicer 113, the slicer 120, etc.

In block 1116, the notch filter circuit 110 is operating and updating of the control loops is re-enabled. The interference detection path 116 continues to analyze data at the input of the notch filter circuit 110 to detect the presence of interference signal. If no interference signal is detected, or the frequency of the detected interference signal changes, then the interference detection path 116 disables the notch filter circuit 110 in block 1118 (e.g., the notch filter circuit 110 is disengaged from the data path and notch filtering is halted). The method 1100 continues in block 1110.

FIG. 12 shows a flow diagram for an example method 1200 for interference detection. Though depicted sequentially as a matter of convenience, at least some of the actions shown can be performed in a different order and/or performed in parallel. Additionally, some implementations may perform only some of the actions shown. Operations of the method 1200 are performed as part of the execution of block 1110 of the method 1100.

In block 1202, the interference detection circuit 810 analyzes the data of the processing channel 136 to determine whether an interference signal is present. The data analyzed is slicer error of the slicer 804 or slicer error of the slicer 814 in various implementations of the method 1200. A coarse (e.g., 512 sample) FFT is applied to the slicer error by the interference detection circuit 810 to convert the slicer error to frequency domain. A magnitude value in the frequency domain slicer error signal that exceeds a threshold is deemed to be an interference signal.

If no interference signal is identified in block 1202, then in block 1204, the interference detection circuit 810 analyzes the data of the processing channel 138 to determine whether an interference signal is present. The data analyzed is slicer error of the slicer 814 in various implementations of the method 1200. A coarse (e.g., 512 sample) FFT is applied to the slicer error by the interference detection circuit 810 to convert the slicer error to frequency domain. A magnitude value in the frequency domain slicer error signal that exceeds a threshold is deemed to be an interference signal. If no interference signal is identified, then the method 1200 continues in block 1202.

If an interference signal is identified in block 1202 or block 1204, then in block 1206, the interference detection circuit 810 applies a fine (e.g., 2048 sample or 4096 sample) FFT to better resolve the frequency of the interference signal. The interference detection circuit 810 applies the fine FFT to the slicer error in which the interference signal was detected only about the frequency of the interference signal identified using the coarse FFT.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Modifications are possible in the described embodiments, and other embodiments are possible, within the scope of the claims.

What is claimed is:
1. A receiver circuit, comprising:
an analog-to-digital converter (ADC) comprising an output;
a notch filter including:
  a signal input coupled to the output of the ADC; and
  an interference frequency input;
a slicer including:
  an input coupled to the signal input of the notch filter; and
  an output;

a slicer error circuit including:
  a first input coupled to the input of the slicer;
  a second input coupled to the output of the slicer; and
  an error output;
an interference detection circuit including:
  an input coupled to the error output of the slicer error circuit; and
  an interference frequency output coupled to the interference frequency input of the notch filter.

2. The receiver circuit of claim 1, further comprising:
a delay circuit including:
  an input coupled to the input of the notch filter; and
  an output coupled to the input of the slicer.

3. The receiver circuit of claim 1, wherein the interference detection circuit includes a fast Fourier transform (FFT) circuit coupled to the error output of the slicer error circuit.

4. The receiver circuit of claim 1, wherein:
the notch filter is a first notch filter;
the slicer is a first slicer; and
the receiver circuit comprises:
  a second notch filter including:
    a signal input coupled to the output of the ADC;
    an interference frequency input coupled to the interference frequency output of the interference detection circuit; and
  a second slicer including:
    an input coupled to the signal input of the second notch filter; and
    an output.

5. The receiver circuit of claim 4, wherein:
the slicer error circuit is a first slicer error circuit; and
the receiver circuit includes:
  a second slicer error circuit including:
    a first input coupled to the input of the second slicer;
    a second input coupled to the output of the second slicer; and
    an error output coupled to the input of the interference detection circuit.

6. The receiver circuit of claim 5, further comprising:
a multiplexer including:
  a first input coupled to the error output of the first slicer error circuit;
  a second input coupled to the error output of the second slicer error circuit; and
  an output coupled to the input of the interference detection circuit.

7. The receiver circuit of claim 6, further comprising:
an interference detection enable circuit including:
  a first input coupled to the error output of the first slicer error circuit;
  a second input coupled to the error output of the second slicer error circuit; and
  an output coupled to an enable input of the interference detection circuit.

8. A receiver circuit, comprising:
an analog-to-digital converter (ADC);
a processing channel configured to process data samples provided by the ADC, and including a notch filter; and
an interference detection path configured to detect interference in the data samples, and including:
  a slicer configured to slice input of the notch filter;
  a slicer error circuit configured to compute an error of the slicer; and
  an interference detection circuit configured to:
    detect an interference signal in the error of the slicer; and
    set the notch filter to attenuate the interference signal.

9. The receiver circuit of claim 8, wherein the interference detection path comprises:
a delay circuit configured to:
  delay input of the notch filter by a delay time of the notch filter; and
  provide delayed input of the notch filter to the slicer.

10. The receiver circuit of claim 8, wherein the interference detection circuit is configured to apply a fast Fourier transform (FFT) to the error of the slicer to identify the interference signal.

11. The receiver circuit of claim 8, wherein:
the interference detection circuit is configured to:
  disable the notch filter based on the interference signal not being detected; and
  enable the notch filter based on the interference signal being detected; and
the notch filter is configured to provide a same delay therethrough whether enabled or disabled.

12. The receiver circuit of claim 8, wherein:
the processing channel is a first processing channel;
the notch filter is a first notch filter;
the data samples are first data samples; and
the receiver circuit includes:
  a second processing channel configured to process second data samples provided by the ADC, and including a second notch filter; and
  the interference detection circuit is configured to set the second notch filter to attenuate the interference signal.

13. The receiver circuit of claim 12, wherein:
the slicer is a first slicer;
the slicer error circuit is a first slicer error circuit; and
the interference detection path includes:
  a second slicer configured to slice input of the second notch filter:
  a slicer error circuit configured to compute an error of the second slicer; and
  a multiplexer configured to route the error of the second slicer to the interference detection circuit based on no interference being detected in the error of the first slicer.

14. The receiver circuit of claim 13, further comprising:
an interference detection enable circuit configured to:
  detect a presence of an interference signal based on an error of the first slicer and the error of the second slicer; and
  enable the interference detection circuit based on a detected presence of the interference signal.

15. The receiver circuit of claim 12, wherein:
the receiver circuit includes N processing channels;
the notch filter is configured to operate at 1/Nth of a processing rate of the N processing channels; and
the second processing channel is configured to process the data samples acquired by the ADC N/2 samples later than the data samples processed by the first processing channel.

16. A digital signal processing circuit, comprising:
a first processing channel configured to process first data samples received from an ADC, and including a first notch filter configured to filter the first data samples;
a second processing channel configured to process second data samples received from the ADC, and including a second notch filter configured to filter the second data samples; and an interference detection path configured to detect interference signal in the first data samples and the second data samples, and including:
  a first slicer configured to slice input of the first notch filter;
  a first slicer error circuit configured to compute an error of the first slicer;
  a second slicer configured to slice input of the second notch filter;
  a second slicer error circuit configured to compute an error of the second slicer;
  a multiplexer configured to select the error of the first slicer or the error of the second slicer as an interference source signal; and
  an interference detection circuit configured to:
    detect an interference signal in the interference source signal; and
    set the first notch filter and the second notch filter to attenuate the interference signal.

17. The digital signal processing circuit of claim 16, wherein the interference detection path comprises:
  a first delay circuit configured to:
    delay input of the first notch filter by a delay time of the first notch filter; and
    provide delayed input of the first notch filter to the first slicer; and
  a second delay circuit configured to:
    delay input of the second notch filter by a delay time of the second notch filter; and
    provide delayed input of the second notch filter to the second slicer.

18. The digital signal processing circuit of claim 16, wherein the interference detection circuit includes a fast Fourier transform (FFT) circuit configured to convert the interference source signal to a frequency domain signal for identification of the interference signal.

19. The digital signal processing circuit of claim 16, wherein:
  interference detection circuit is configured to:
    responsive to detection of the interference signal: disengage the first notch filter and the second notch filter for a settling interval; and
    after expiration of the settling interval: engage the first notch filter and the second notch filter.

20. The digital signal processing circuit of claim 16, further comprising an interference detection enable circuit configured to:
  detect a presence of the interference signal based on a sum of the error of the first slicer and the error of the second slicer exceeding a threshold; and
  enable the interference detection circuit based on a detected presence of the interference signal.

* * * * *